United States Patent [19]

Carney et al.

[11] Patent Number: 4,637,122
[45] Date of Patent: Jan. 20, 1987

[54] INTEGRATED QUANTUM WELL LASERS FOR WAVELENGTH DIVISION MULTIPLEXING

[75] Inventors: James K. Carney, Eden Prairie; Robert M. Kolbas, Bloomington, both of Minn.

[73] Assignee: Honeywell Inc., Minneapolis, Minn.

[21] Appl. No.: 759,798

[22] Filed: Jul. 29, 1985

Related U.S. Application Data

[62] Division of Ser. No. 533,187, Sep. 19, 1983, Pat. No. 4,577,321.

[51] Int. Cl.$^4$ .................... H01L 21/18; H01L 21/20
[52] U.S. Cl. .............................. 29/569 L; 29/576 E; 148/175; 148/DIG. 66; 148/DIG. 95; 148/DIG. 72
[58] Field of Search .................... 29/569 L, 576 E; 357/17; 372/46, 47, 48, 50; 148/DIG. 65, DIG. 66, DIG. 72, DIG. 95, 174, 175; 727/38

[56] References Cited

U.S. PATENT DOCUMENTS

| | | | |
|---|---|---|---|
| 4,318,058 | 3/1982 | Mito et al. | 372/50 |
| 4,476,563 | 10/1984 | Van Ruyven | 372/50 |
| 4,547,956 | 10/1985 | Bouadma et al. | 29/569 L |
| 4,558,336 | 12/1985 | Chang et al. | 357/17 |
| 4,573,161 | 2/1986 | Sakai et al. | 372/45 |

OTHER PUBLICATIONS

Aiki et al., "A Frequency Multiplexing Light Source with Monolithically Integrated Distributed-Feedback Diode Lasers", IEEE Jr. of Quan. Elect., vol. QE13, No. 4, Apr. 1973, pp. 220-223.
Alferov et al., "Wavelength Multiplexing DH AlGaAs Injection Laser Source with a Graded Composition Along the Active Layer", Jr. of Quant. Elect., vol. QE-17, No. 8, Aug. 1981, pp. 1530-1533.
Tsang, "CW Multiwavelength Transverse Junction Stripe Lasers Grown by Molecular Beam Epitaxy Operating Predominantly in Single-Longitudinal Modes", App. Phys. Letters, 36(6), Mar. 15, 1980, pp. 441-443.

Primary Examiner—Brian E. Hearn
Assistant Examiner—John T. Callahan
Attorney, Agent, or Firm—Omund R. Dahle

[57] ABSTRACT

An integrated quantum well laser structure which has a plurality of quantum well lasers for providing a plurality of light beams each having a different wavelength for use in wavelength division multiplexing.

2 Claims, 3 Drawing Figures

INTEGRATED QUANTUM WELL LASERS FOR WAVELENGTH DIVISION MULTIPLEXING

This application is a division of application Ser. No. 533,187, filed 9/19/83, now U.S. Pat. No. 4,577,321.

BACKGROUND AND SUMMARY OF THE INVENTION

The invention is directed to the field of optical multiplexing and more specifically to linear arrays of integrated quantum well lasers for wavelength division multiplexing.

In the prior art there has been described wavelength division (frequency) multiplexing using several different methods for obtaining a number of differing but closely spaced optical wavelengths. An article by Aiki, Nakamura and Umeda, "A Frequency Multiplexing Light Source with Monolithically Integrated Distributed-Feedback Diode Lasers" IEEE Jr.of Quan.Elect., Vol.QE-13, No. 4, April 1977, P220–223, describes a light source consisting of a plurality of GaAs-AlGaAs distributed-feedback (DFB) diode lasers with different grating periods so that the lasers lase with different wavelengths having a separation of about 20 Å. One major disadvantage to this approach is that the difference in the gratings causes many of the lasers to emit at wavelengths other than at the peak of their gain curve. Therefore, the lasing threshold current changes from laser-to-laser. An article by Alferov et al, "Wavelength Multiplexing DH AlGaAs Injection Laser Source with a Graded Composition Along the Active Layer", Jr.of Quan.Elect., Vol.QE-17, No. 8, August 1981, P1530–33, describes the use of DH AlGaAs wafers with graded composition along the active layer for creation of multi-wavelength laser source for wavelength division multiplexing. An article by Tsang, "CW Multiwavelength Transverse Junction Stripe Lasers Grown by Molecular Beam Epitaxy Operating Predominantly in Single-Longitudinal Modes", Appl.Phys.Letters 36(6), Mar. 15, 1980, P441-3, describes a new transverse junction stripe laser structure with multiple active layers each emitting a different wavelength. This is not true WDM because all wavelengths will contain the same data.

In the present invention an integrated quantum well laser array for wavelength division multiplexing is described having many lasers per output channel all grown on the same substrate and wherein a controlled variation of the active layer thickness from one of the plurality of lasers to the next is used to provide lasers of different wavelengths.

DESCRIPTIONS

The inventionn disclosed is directed to a large array of lasers for wavelength division multiplexing (WDM) in which perhaps 20 lasers are all grown on the same substrate. In a WDM operation with many lasers per output channel, a large wavelength range must be covered, for example about 100 Å. Each of these lasers must lase at a wavelength slightly different from the preceding laser (say by 5 Å or more), and it is desired that each laser will lase at a wavelength near the peak of its gain curve.

Figure 1:
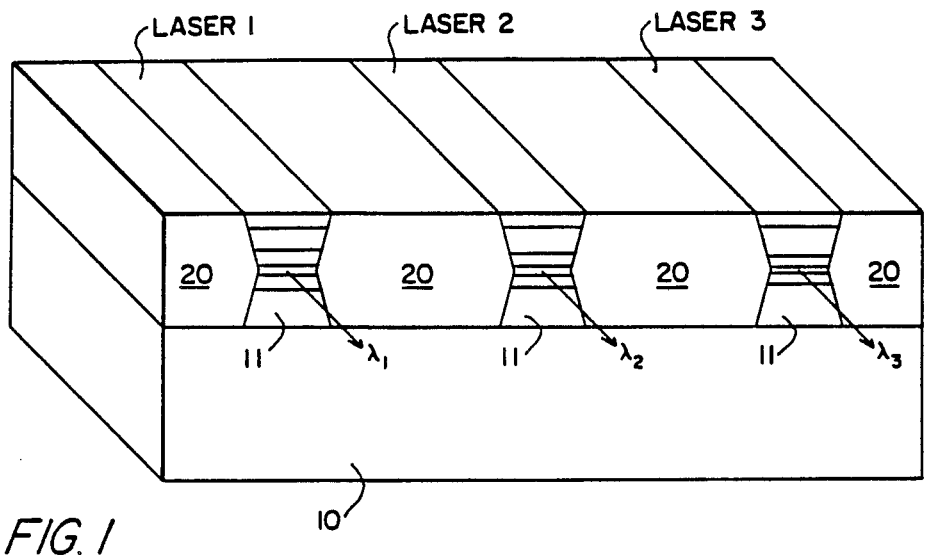
FIG. 1 is a diagrammatic end view of an array of integrated buried heterostructure lasers whose active regions are formed by microlayers with different thicknesses.

In FIG. 1 an abbreviated end view of an array of three such lasers is shown. For this example a buried heterostructure type laser is described. For these lasers an n-type GaAs substrate 10 has grown thereover by MOCVD (metal-organic chemical vapor deposition), or MBE (molecular beam epitaxy) a number of layers. A first cladding layer 11 covers the substrate surface in the initial process, the cladding layer may be $Al_xGa_{1-x}As$ where x $0.3 \lesssim x \lesssim 0.4$.

Figure 2:
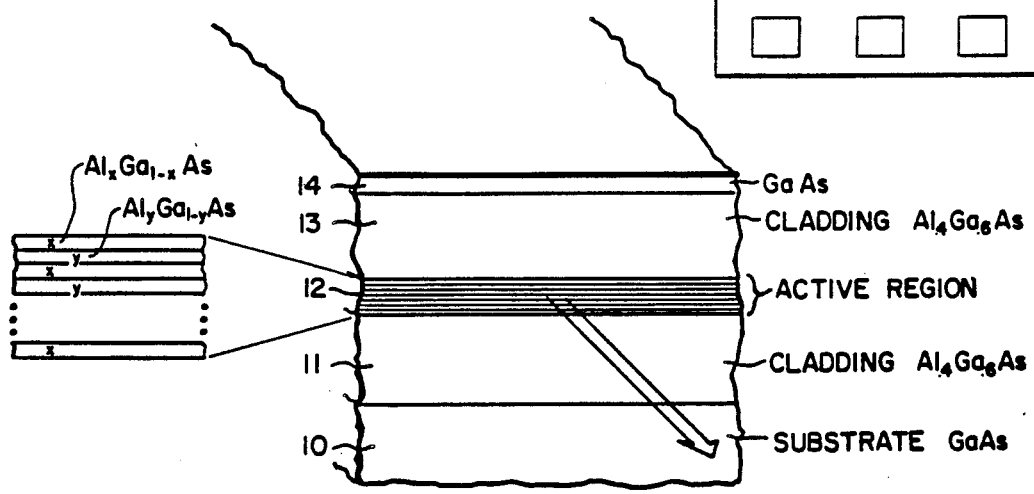
FIG. 2 is an edge view of a portion of FIG. 1.

FIG. 2 shows in more detail these layers. The quantum well active region 12 comprising a series of alternating thin layers of $Al_xGa_{1-x}As$ (narrow band-gap well layers) and $Al_yGa_{1-y}As$ ($x \neq y$) (wide band-gap barrier layers) followed by a final $Al_xGa_{1-x}As$ layer are grown over the entire layer. In the active region the $Al_xGa_{1-x}As$ well layers, x may be $\lesssim 0$ for example, and the $Al_yGa_{1-y}As$ barrier layers, y may be 0.3. A controlled variation in the layer thickness of quantum well active region 12, at various locations of the wafer is used to provide lasers with different wavelengths. Such a method of thickness variation at various points on the wafer may be accomplished by either using a vapor growth (MOCVD) or MBE. The variation in layer thickness may be accomplished for example, by etching a pattern in the substrate to change the growth rate at various points on the wafer, or shadow masking the wafer during growth. Another cladding layer 13 is then grown over the active layers, followed by a GaAs layer 14 to which electrical contact can be made. Thus the grown layers 11, 12, 13, and 14 all cover the area of the substrate 10. The structure so far described must now be divided into multiple isolated lasers. For the buried heterostructure laser embodiment shown in FIG. 1, the isolation is accomplished by etching.

Locations for the multiple lasers are determined. The unwanted layer material between the individual buried heterostructure lasers (that is, in FIG. 1, between lasers 1, 2 and 3) is etched out leaving the lasers standing like mesas, and then the etched regions are refilled by growing cladding material 20 to fill the voids and thereby to provide isolation between the individual quantum well lasers.

Figure 3:
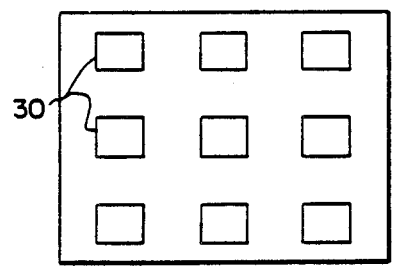
FIG. 3 represents a full wafer with multiple identical arrays.

Many identical arrays can be formed on a single substrate by repeating the pattern that produces the thickness variation as shown in FIG. 3. FIG. 3 represents a full wafer with multiple identical patterned areas 30 where multiple identical laser arrays will be grown. This is similar to producing multiple identical chips to integrated circuit design. The patterned areas 30 may be etched into the wafer surface. The multiple lasers are formed in each etched region as shown in FIG. 1.

There has been described herein the patterning of the wafer to produce many lasers of differing wavelength in a single growth process. The composition of the layers each of the many quantum well lasers on the wafer is the same. In quantum well lasers, the lasing wavelength is determined in part by the thicknesses of the microlayers in the active region. By changing the thickness of the microlayers in a controlled, known manner, then an array of lasers can be fabricated in which the emission wavelength separation between lasers is derived by fabricating lasers at the points where the known thickness of the quantum well layers produces the proper wavelengths. This structure will be useful for wavelength division multiplexing. In FIG. 1 it may be seen that the active region of laser 1 is thicker than the active region of laser 2 which in turn is thicker than the active region of laser 3. One advantage is that each of the integrated lasers is operating at a wavelength near the peak of its gain curve so that a low threshold current results for each laser. This simplifies the design of the integrated electronic circuit which drives the individual multiple quantum well lasers in the wavelength division multiplexing laser means.

Although the specification has described the array basically in terms of an AlGaAs-GaAs device, it is not intended to be so limited and the structure may be other than GaAs, such as InP and $In_xG_{1-x}As_yP_{1-y}$.

The embodiments of the invention in which an exclusive property or rights is claimed are defined as follows:

1. A process of fabricating an integrated quantum well laser structure which has a plurality of quantum well lasers for providing a plurality of light beams each having a different wavelength, the process steps comprising:
   (a) providing a gallium arsenide substrate having a planar surface and patterning the substrate so that a spatial variation in epitaxial growth rates will occur;
   (b) growing over said surface a first cladding layer;
   (c) growing over said cladding layer an active sandwich layer which includes growing alternating thin layers of $Al_xGa_{1-x}As$ and $Al_yGa_{1-y}As$ followed by a final $Al_xGa_{1-x}As$ layer, said active sandwich layer having a controlled variation in thickness over the surface of said cladded substrate wherein said thickness is different from one to the next of said plurality of quantum well lasers;
   (d) growing a second cladding layer over said active sandwich layer;
   (e) growing a gallium arsenide layer over said second cladding layer;
   (f) locating the position of the individual multiple lasers in the structure and etching away the unwanted layer material between the individual lasers down to the substrate to create voids between the individual lasers; and,
   (g) refilling the voids by growing further cladding material into the voids to thereby provide isolation between the individual quantum well lasers.

2. A process of fabricating an integrated quantum well laser structure which has a plurality of quantum well lasers for providing a plurality of light beams each having a different wavelength, the process steps comprising:
   (a) providing a single crystal semiconductor substrate having a planar surface and patterning the substrate so that a spatial variation in epitaxial growth rates will occur;
   (b) growing over said surface a first cladding layer;
   (c) growing over said cladding layer an active sandwich layer which includes growing alternating thin layers of narrow band-gap well layers and wide band-gap barrier layers and a final narrow band-gap well layer, said active sandwich layer having a controlled variation in thickness over the surface of said cladded substrate wherein said thickness is different from one to the next of said plurality of quantum well lasers;
   (d) growing a second cladding layer over said active sandwich layer;
   (e) growing a conductive layer over said second cladding layer;
   (f) locating the position of the individual multiple lasers in the structure and etching away the unwanted layer material between the individual lasers down to the substrate to create voids between the individual lasers; and,
   (g) refilling the voids by growing further cladding material into the voids to thereby provide isolation between the individual quantum well lasers.

* * * * *